(12) United States Patent
Shon et al.

(10) Patent No.: US 9,071,241 B2
(45) Date of Patent: Jun. 30, 2015

(54) DATA OUTPUT CIRCUIT AND OPERATING METHOD WITH REDUCED CURRENT OVERLAP FOR SEMICONDUCTOR DEVICE

(71) Applicant: SK hynix Inc., Gyeonggi-do (KR)

(72) Inventors: Kwan-Su Shon, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 238 days.

(21) Appl. No.: 13/708,562

(22) Filed: Dec. 7, 2012

(65) Prior Publication Data

US 2013/0147517 A1    Jun. 13, 2013

(30) Foreign Application Priority Data

Dec. 8, 2011    (KR) ......................... 10-2011-0130938

(51) Int. Cl.
*H03K 19/0175*    (2006.01)
*G06F 1/10*    (2006.01)
*H03K 19/003*    (2006.01)
*H03K 19/096*    (2006.01)

(52) U.S. Cl.
CPC .......... *H03K 19/017509* (2013.01); *G06F 1/10* (2013.01); *H03K 19/00315* (2013.01); *H03K 19/00369* (2013.01); *H03K 19/0963* (2013.01)

(58) Field of Classification Search
None
See application file for complete search history.

(56) References Cited

U.S. PATENT DOCUMENTS

| | | | | |
|---|---|---|---|---|
| 6,323,687 B1 * | 11/2001 | Yano | ................................ | 326/83 |
| 6,707,331 B1 * | 3/2004 | Nguyen | ........................ | 327/166 |
| 7,053,679 B2 * | 5/2006 | Rho | .............................. | 327/108 |
| 7,449,913 B1 * | 11/2008 | Hung | .............................. | 326/27 |
| 7,449,936 B2 * | 11/2008 | Shin et al. | ...................... | 327/378 |
| 7,576,581 B2 * | 8/2009 | Shin et al. | ...................... | 327/175 |
| 7,760,561 B2 * | 7/2010 | Lee | ........................... | 365/189.15 |
| 8,441,870 B2 * | 5/2013 | Kim | .............................. | 365/193 |

FOREIGN PATENT DOCUMENTS

KR    1020010036452    5/2001

* cited by examiner

*Primary Examiner* — Jason M Crawford
*Assistant Examiner* — Nelson Correa
(74) *Attorney, Agent, or Firm* — IP & T Group LLP

(57) ABSTRACT

A semiconductor device includes a clock delay unit configured to delay a source clock by a given delay amount and generate a delayed source clock, a driving signal generation unit configured to decide logic levels of first and second driving signals based on a value of input data, to select one of the source clock and the delayed source clock based on current logic levels of the first and second driving signal's, which are detected based on the source clock, and to use a selected clock as a reference of an operation for determining next logic levels of the first and second driving signals, and an output pad driving unit configured to drive a data output pad with a first voltage in response to the first driving signal, and to drive the data output pad with a second voltage in response to the second driving signal.

20 Claims, 5 Drawing Sheets

DATA OUTPUT CIRCUIT AND OPERATING METHOD WITH REDUCED CURRENT OVERLAP FOR SEMICONDUCTOR DEVICE

CROSS-REFERENCE TO RELATED APPLICATIONS

The present application claims priority of Korean Patent Application No. 10-2011-0130938, filed on Dec. 8, 2011, which is incorporated herein by reference in its entirety.

BACKGROUND

1. Field

Exemplary embodiments of the present invention relate to a semiconductor design technology, and more particularly, to a data output circuit of a semiconductor device.

2. Description of the Related Art

Semiconductor devices including DRAM may have a data output circuit for driving an output pad according to output data.

FIG. 5 is a block diagram illustrating a data output circuit of a conventional semiconductor device.

Referring to FIG. 5, the data output circuit of the conventional semiconductor device includes a pre-driver 50 that is configured to output a pull-up and a pull-down control signals S1 and S2 according to an input data IN_DATA, a PMOS transistor PM that is configured to drive an output terminal DQ with a power supply voltage VDD in response to the pull-up control signal S1, and a NMOS transistor NM that is configured to drive the output terminal DQ with a ground voltage VSS in response to the pull-down control signal S2.

When input data IN_DATA is not inputted to the pre-driver 50, the pre-driver 50 outputs the pull-up and pull-down control signals S1 and S2 at logic 'high' and logic 'low' levels, and thus, the transistors PM and NM are turned off to disable the output terminal DQ.

When the input data IN_DATA is inputted to the pre-driver 50 at a logic 'high' level, the pre-driver 50 applies the pull-up and pull-down control signals S1 and S2 of logic 'low' level to the transistors PM and NM, and thus, the PMOS transistor PM is turned on and the output terminal DQ is driven to the power supply voltage VDD.

When the input data IN_DATA is at a logic 'low' level, the pre-driver 50 applies the pull-up and pull-down control signals S1 and S2 of logic 'high' level to the transistors PM and NM, and thus, the NMOS transistor NM is turned on and the output terminal DQ is driven to the ground voltage VSS.

However, in the data output circuit of the conventional semiconductor device, when the input data IN_DATA is continuously input and the number of bits of the input data IN_DATA is increased, switching times of the transistors PM and NM for pull-up and pull-down may become short. Accordingly, a through current is generated between the power supply voltage VDD and the ground voltage VSS, and an overlapping phenomenon occurs. The overlapping phenomenon in the data output circuit may cause unnecessary power consumptions.

SUMMARY

Exemplary embodiments of the present invention are directed to an output circuit of a semiconductor device capable of substantially preventing overlapping.

Furthermore, another embodiment of the present invention is directed to an output circuit of a semiconductor device capable of substantially preventing the occurrence of address access delay time (tAA) loss in the process of performing an operation for substantially preventing overlapping.

In accordance with an embodiment of the present invention, a semiconductor device includes a clock delay unit configured to delay a source clock by a given delay amount and generate a delayed source clock; a driving signal generation unit configured to decide logic levels of a first driving signal and a second driving signal based on a value of input data, to select one of the source clock and the delayed source clock based on current logic levels of the first driving signal and the second driving signal, which are detected based on the source clock, and to use a selected clock as a reference of an operation for determining next logic levels of the first driving signal and the second driving signal; and an output pad driving unit configured to drive a data output pad with a first voltage in response to the first driving signal, and to drive the data output pad with a second voltage in response to the second driving signal.

In accordance with another embodiment of the present invention, an operation method of a semiconductor device includes delaying a source clock by a given delay amount and generating a delayed source clock; detecting current logic levels of a first driving signal and a second driving signal based on a source clock; selecting one of the source clock and the delayed source clock based on a result of the detecting of the current logic levels, and using a selected clock as a reference of an operation for determining next logic levels of the first driving signal and the second driving signal; and driving a data output pad with a first voltage in a first logic level period of the first driving signal, and driving the data output pad with a second voltage in a second logic level period of the second driving signal.

According to exemplary embodiments of the present invention, pull-up and pull-down driving operations to the data output pad may be performed while maintaining a given time difference, thereby substantially preventing the overlapping phenomenon from occurring in the data output circuit.

Furthermore, operations for determining the logic level of the first and second driving signal for defining the pull-up and pull-down driving operations may be performed in synchronization with a clock, thereby substantially preventing the tAA loss from occurring in data output from the data output pad based on a PVT (Process, Voltage, and Temperature) variation.

DETAILED DESCRIPTION

Figure 1:
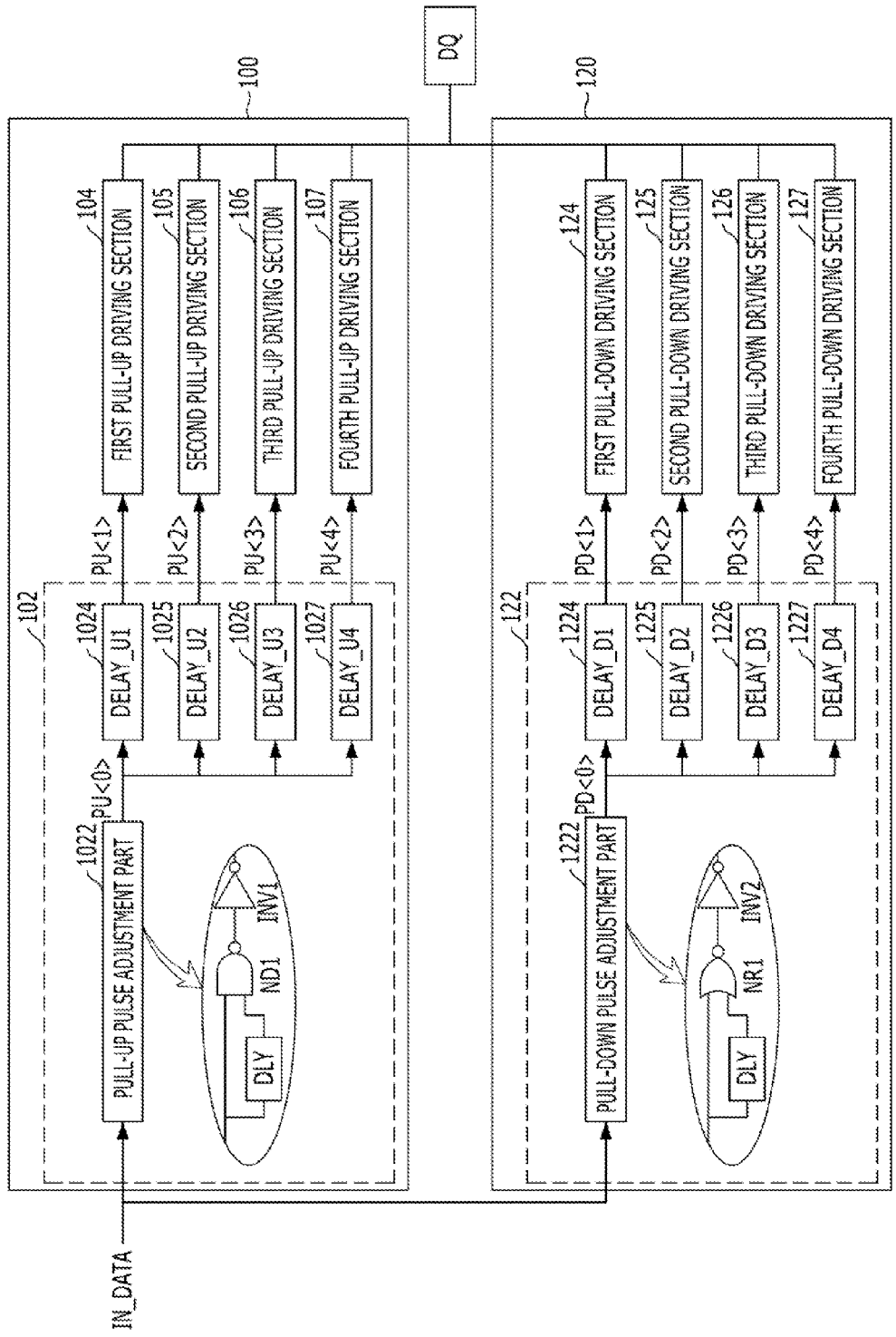
FIG. 1 is a block diagram illustrating a data output circuit of a semiconductor device capable of substantially preventing overlapping.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a data output circuit of a semiconductor device capable of substantially preventing overlapping.

Referring to FIG. 1, the data output circuit of the semiconductor device includes a pull-up operation unit 100 and a pull-down operation unit 120. The pull-up operation unit 100 includes a pull-up signal generation section 102 and first to fourth pull-up driving sections 104 to 107. The pull-up signal generation section 102 includes a pull-up pulse adjustment part 1022 and first to fourth pull-up delay elements 1024 to 1027. The pull-down operation unit 120 includes a pull-down signal generation section 122 and first to fourth pull-down driving sections 124 to 127. The pull-down signal generation section 122 includes a pull-down pulse adjustment part 1222 and first to fourth pull-down delay elements 1224 to 1227.

The pull-up operation unit 100 is configured to drive a data output pad DQ to a logic 'high' level when input data IN_DATA is at a logic 'high' level. The pull-down operation unit 120 is configured to drive the data output pad DQ to a logic 'low' level when the input data IN_DATA is at a logic 'low' level.

The pull-up pulse adjustment part 1022 included in the pull-up signal delay section 102 is configured to reduce the length of a period, in which the input data IN_DATA is at the logic 'high' level, by a given delay amount to substantially prevent the overlapping phenomenon from occurring.

In detail, the pull-up pulse adjustment part 1022 may include a delay element DLY, a NAND gate ND1, and an inverter INV1. The delay element DLY is configured to delay the input data IN_DATA by the given delay amount. The NAND gate ND1 is configured to perform an AND operation on the input data IN_DATA and output data of the delay element DLY to output resultant signal PU<0>.

The pull-down pulse adjustment part 1222 included in the pull-down signal delay section 122 is configured to reduce the length of a period, in which the input data IN_DATA is at the logic 'low' level, by a given delay amount to substantially prevent the overlapping phenomenon from occurring.

In detail, the pull-down pulse adjustment part 1222 may include a delay element DLY, a NOR gate NR1, and an inverter INV2. The delay element DLY is configured to delay the input data IN_DATA by the given delay amount. The NOR gate NR1 is configured to perform a NOR operation on the input data IN_DATA and output data of the delay element DLY to output resultant signal PD<0>.

That is, the pull-up pulse adjustment part 1022 and the pull-down pulse adjustment part 1222 are configured to reduce the logic 'high' period and the logic 'low' period of the input data IN_DATA by the given delay amount, thereby substantially preventing the occurrence of the overlapping phenomenon representing that the logic 'high' period and the logic 'low' period overlap each other when the input data IN_DATA is driven to the data output pad DQ.

The first to fourth pull-up delay elements 1024 to 1027 included in the pull-up signal generation section 102 are configured to minimize a variation in a skew in correspondence with PVT (Process, Voltage, and Temperature) variation when the logic 'high' period of the input data IN_DATA is driven to the data output pad DQ.

Since the first to fourth pull-up delay elements 1024 to 1027 have different delay amounts, respectively, signals PU<1:4> output through the first to fourth pull-up delay elements 1024 to 1027 have a given time difference. Consequently, the same logic 'high' period of the input data IN_DATA is continuously driven to the data output pad DQ while maintaining the given time difference, and thus, a skew of the logic 'high' period of the input data IN_DATA driven to the data output pad DQ may be minimized in correspondence with PVT variation.

The first to fourth pull-down delay elements 1224 to 1227 included in the pull-down signal generation section 122 are configured to minimize the variation in the skew in correspondence with PVT variation when the logic 'low' period of the input data IN_DATA is driven to the data output pad DQ.

Since the first to fourth pull-down delay elements 1224 to 1227 have different delay amounts, respectively, signals PD<1:4> output through the first to fourth pull-down delay elements 1224 to 1227 have a given time difference. Consequently, the same logic 'low' period of the input data IN_DATA is continuously driven to the data output pad DQ while maintaining the given time difference, and thus, a skew of the logic 'low' period of the input data IN_DATA driven to the data output pad DQ may be minimized in correspondence with PVT variation.

The first to fourth pull-up driving sections 104 to 107 are configured to drive the data output pad DQ with the power supply voltage VDD in a period in which signals PU<1:4> output from the pull-up signal generation section 102 are at a logic 'high' level. In order to drive the data output pad DQ with the power supply voltage VDD, since it may be most effective to use a PMOS transistor, the phases of the signals PU<1:4> output from the pull-up signal generation section 102 may be inverted, and then the data output pad DQ is driven with the power supply voltage VDD using first to fourth PMOS transistors (not illustrated).

The first to fourth pull-down driving sections 124 to 127 are configured to drive the data output pad DQ with the ground voltage VSS in a period in which signals PD<1:4> output from the pull-down signal generation section 122 are at a logic 'low' level. In order to drive the data output pad DQ with the ground voltage VSS, since it may be most effective to use a NMOS transistor, the phases of the signals PD<1:4> output from the pull-down signal generation section 122 may be inverted, and then the data output pad DQ is driven with the ground voltage VSS using first to fourth NMOS transistors (not illustrated).

Figure 2:
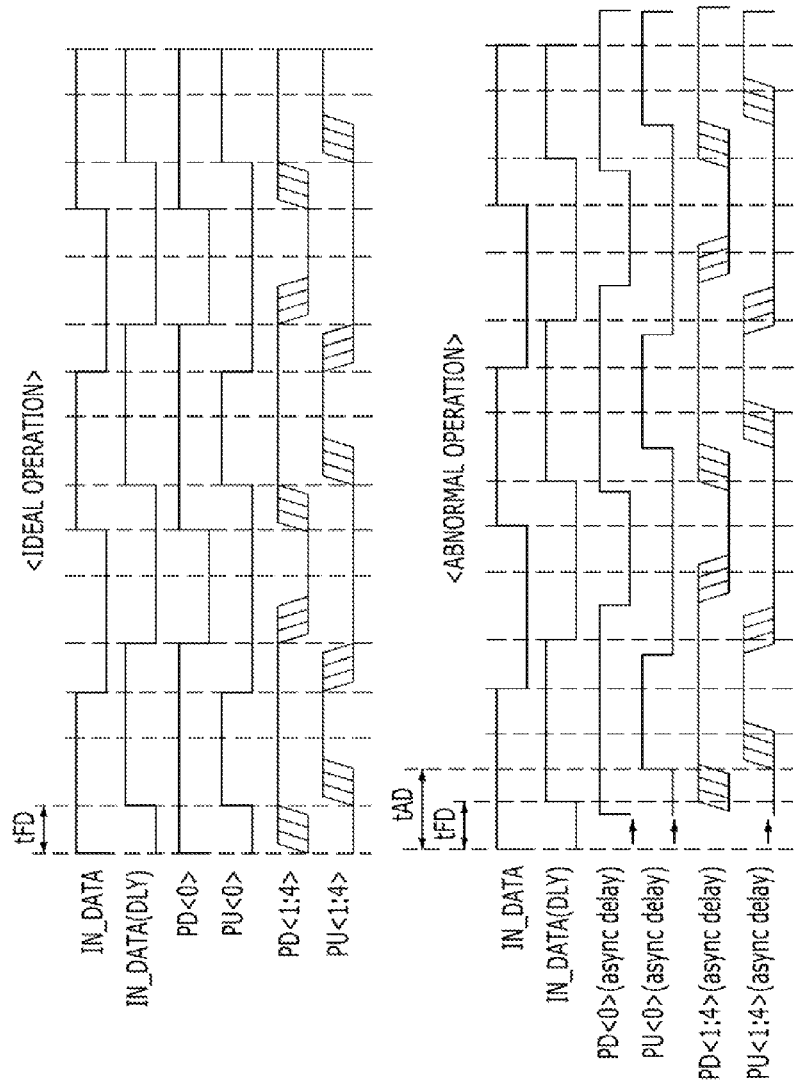
FIG. 2 is a timing diagram illustrating the operation of the data output circuit shown in FIG. 1.

FIG. 2 is a timing diagram illustrating the operation of the data output circuit shown in FIG. 1.

Referring to FIG. 2, an ideal operation and an actual or abnormal operation of the data output circuit of the semiconductor device capable of substantially preventing overlapping are compared with other.

First, the ideal operation of the data output circuit of the semiconductor device capable of substantially preventing overlapping will be described. The input data IN_DATA and data IN_DATA(DLY), which is obtained by delaying the input data IN_DATA by a given delay amount tFD, are generated.

Then, a signal is an output signal PU<0> of the pull-up pulse adjustment part 1022, wherein the signal is activated to a logic 'high' level in correspondence with a duration in which a logic 'high' period of the input data IN_DATA overlaps a logic 'high' period of the delayed input data IN_DATA (DLY).

Furthermore, signals obtained by delaying the output signal PU<0> of the pull-up pulse adjustment part 1022 step by step are output signals PU<1:4> of the first to fourth pull-up delay elements 1024 to 1027.

In this way, the data output pad DQ is pull-up driven with the power supply voltage VDD in a period in which the output signals PU<1:4> of the first to fourth pull-up delay elements 1024 to 1027 are at a logic 'high' level.

At this time, as the output signals PU<1:4> of the first to fourth pull-up delay elements 1024 to 1027 are at a logic 'high' level while substantially maintaining a time difference, a skew of a period in which the data output pad DQ is pulled up with the power supply voltage VDD is determined, so that the skew of the period in which the data output pad DQ is pulled up with the power supply voltage VDD may be stabilized even when there occurs a PVT (Process, Voltage, and Temperature) variation such as a variation in the level of the power supply voltage VDD.

Similarly, a signal is an output signal PD<0> of the pull-down pulse adjustment part 1222, wherein the signal is activated to a logic 'low' level in correspondence with a duration in which a logic 'low' period of the input data IN_DATA overlaps a logic 'low' period of the delayed input data IN_DATA(DLY).

Furthermore, signals obtained by delaying the output signal PD<0> of the pull-down pulse adjustment part 1222 step by step are output signals PD<1:4> of the first to fourth pull-down delay elements 1224 to 1227.

In this way, the data output pad DQ is driven with the ground voltage VSS in a period in which the output signals PD<1:4> of the first to fourth pull-down delay elements 1224 to 1227 are at a logic 'low' level.

At this time, as the output signals PD<1:4> of the first to fourth pull-down delay elements 1224 to 1227 are at a logic 'low' level while substantially maintaining a time difference, a skew of a period in which the data output pad DQ is pulled down with the ground voltage VSS is determined, so that the skew of the period in which the data output pad DQ is pulled down with the ground voltage VSS may be stabilized even when there occurs a PVT (Process, Voltage, and Temperature) variation such as a variation in the level of the power supply voltage VDD.

It may be understood that the logic 'high' period of the output signals PU<1:4> of the first to fourth pull-up delay elements 1024 to 1027 and the logic 'low' period of the output signals PD<1:4> of the first to fourth pull-down delay elements 1224 to 1227, which are generated through the process as described above, are set not to overlap with each other.

This is because an overlapping phenomenon is occurred when the activation periods of the two pulses PU<1:4> and PD<1:4> overlap each other, and thus, a through current is generated between the first to fourth pull-up driving sections 104 to 107 and the first to fourth pull-down driving sections 124 to 127. In order to substantially prevent the generation of the through current, the generation of the overlapping phenomenon may be substantially prevented through the operations of the pull-up pulse adjustment part 1022 and the pull-down pulse adjustment part 1222, which delay the input data IN_DATA by a given time tFD.

Next, the actual or abnormal operation of the data output circuit of the semiconductor device capable of substantially preventing overlapping will be described. Similar to the ideal operation, the input data IN_DATA and the data IN_DATA (DLY), which is obtained by delaying the input data IN_DATA by the given delay amount tFD, are generated.

Then, a signal is the output signal PU<0> of the pull-up pulse adjustment part 1022, wherein the signal is activated to a logic 'high' level in correspondence with the duration in which the logic 'high' period of the input data IN_DATA overlaps the logic 'high' period of the delayed input data IN_DATA(DLY).

However, the data output circuit of the semiconductor device capable of substantially preventing overlapping as illustrated in FIG. 1 uses the NAND gate ND1 and the inverter INV1 to find the duration in which the logic 'high' period of the input data IN_DATA overlaps the logic 'high' period of the delayed input data IN_DATA(DLY), and to find the period in which the output signal PU<0> of the pull-up pulse adjustment part 1022 is activated to a logic 'high' level.

At this time, the NAND gate ND1 and the inverter INV1 may have an arbitrary delay amount async delay in an operation process. For example, when the level of the power supply voltage VDD in the abnormal operation is further higher or lower than the estimated level of the power supply voltage VDD in a design, it is possible to delay an input signal through the arbitrary delay amount async delay.

Therefore, as illustrated in the abnormal operation of FIG. 2, the output signal PU<0> of the pull-up pulse adjustment part 1022 may be delayed by a delay amount tAD larger than an estimated delay amount tFD. When such a phenomenon occurs, data output through the data output pad DQ is further delayed than estimation and is output, so that tAA (address access delay time) loss may occur.

Similarly, a signal is the output signal PD<0> of the pull-down pulse adjustment part 1222, wherein the signal is activated to a logic 'low' level in correspondence with the duration in which the logic 'low' period of the input data IN_DATA overlaps the logic "low' period of the delayed input data IN_DATA(DLY).

However, the data output circuit of the semiconductor device capable of substantially preventing overlapping as illustrated in FIG. 1 uses the NOR gate NR1 and the inverter INV2 to find the duration in which the logic 'low' period of the input data IN_DATA overlaps the logic 'low' period of the delayed input data IN_DATA(DLY), and to find the period in which the output signal PD<0> of the pull-down pulse adjustment part 1222 is activated to a logic 'low' level.

At this time, the NOR gate NR1 and the inverter INV2 may have an arbitrary delay amount async delay in an operation process. For example, when the level of the power supply voltage VDD in the abnormal operation is higher or lower than the estimated level of the power supply voltage VDD in a design, it is possible to delay a signal input through the arbitrary delay amount async delay.

Therefore, as illustrated in the abnormal operation of FIG. 2, the output signal PD<0> of the pull-down pulse adjustment part 1222 may be delayed by a delay amount tAD larger than an estimated delay amount tFD. When such a phenomenon occurs, data output through the data output pad DQ is further delayed than estimation and is output, so that tAA loss may occur.

The tAA, in general, represents a time until corresponding data is output through a data output pad based on an address input together with a read command. Therefore, when the data output through the data output pad DQ is delayed more than a given time point and is output, the tAA loss may occur.

Figure 3:
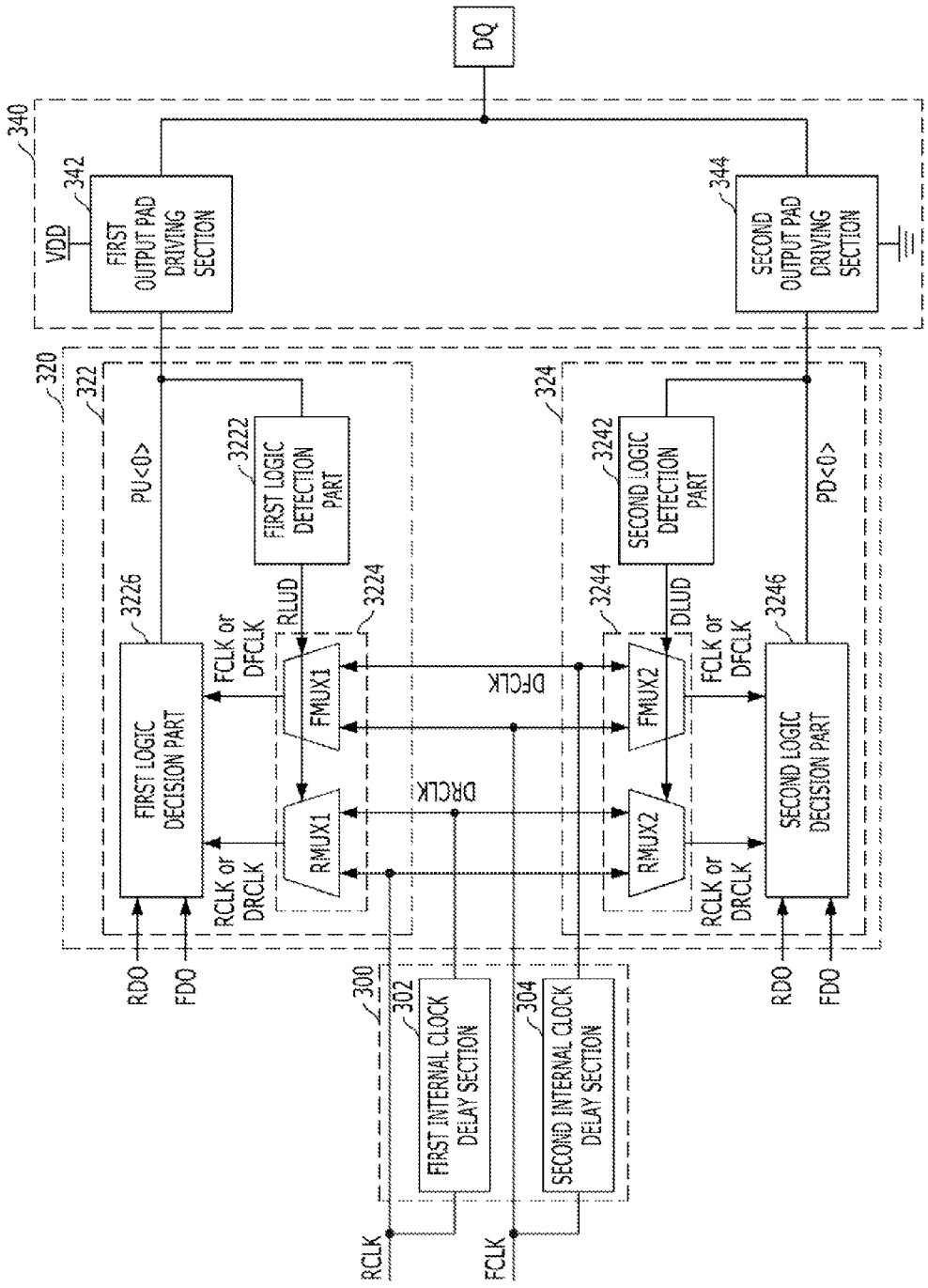
FIG. 3 is a block diagram illustrating a data output circuit of a semiconductor device in accordance with an embodiment of the present invention.

FIG. 3 is a block diagram illustrating a data output circuit of a semiconductor device in accordance with an embodiment of the present invention.

Referring to FIG. 3, the semiconductor device capable of substantially preventing overlapping in accordance with the embodiment of the present invention includes a clock delay unit 300, a driving signal generation unit 320, and an output pad driving unit 340. The clock delay unit 300 includes a first internal clock delay section 302 and a second internal clock delay section 304. The driving signal generation unit 320 includes a first driving signal output section 322 and a second driving signal output section 324. The first driving signal output section 322 includes a first logic detection part 3222, a first clock selection output part 3224, and a first logic decision part 3226. The second driving signal output section 324 includes a second logic detection part 3242, a second clock selection output part 3244, and a second logic decision part 3246. The output pad driving unit 340 includes a first output pad driving section 342 and a second output pad driving section 344.

The clock delay unit 300 is configured to delay source clocks RCLK and FCLK by a given delay amount and generate delayed source clocks DRCLK and DFCLK.

The source clocks RCLK and FCLK include a first internal clock RCLK and a second internal clock FCLK, respectively, and generally indicate one source clock (not illustrated) having a first edge set in correspondence with a first edge of the first internal clock RCLK, and a second edge set in correspondence with a second edge of the second internal clock FCLK.

Of course, the first internal clock RCLK and the second internal clock FCLK may have phases independent of each other. In such a case, the first internal clock RCLK and the second internal clock FCLK should be set to have at least a phase difference of a given size.

As described above, since the source clocks RCLK and FCLK actually include the first internal clock RCLK and the second internal clock FCLK, the clock delay unit 300 includes the first internal clock delay section 302 for delaying the first internal clock RCLK by a given delay amount and outputting the first delayed internal clock DRCLK, and the second internal clock delay section 304 for delaying the second internal clock FCLK by a given delay amount and outputting the second delayed internal clock DFCLK.

The driving signal generation unit 320 is configured to decide logic levels of a first driving signal PU<0> and a second driving signal PD<0> based on values of input data RD0 and FD0. At this time, the driving signal generation unit 320 is configured to select one of the source clocks RCLK and FCLK and the delayed source clocks DRCLK and DFCLK based on the logic levels of the first driving signal PU<0> and the second driving signal PD<0>, which are detected based on the source clocks RCLK and FCLK, and to use the selected clock as a reference clock of an operation for determining next logic levels of the first driving signal PU<0> and the second driving signal PD<0>.

That is, the driving signal generation unit 320 is configured to select one of the source clocks RCLK and FCLK and the delayed source clocks DRCLK and DFCLK based on the logic levels of the first driving signal PU<0> and the second driving signal PD<0> before generation time points of the first edges of the source clocks RCLK and FCLK, and to determine the logic levels of the first driving signal PU<0> and the second driving signal PD<0> after generation time points of the first and second edges of the selected clock based on the input data RD0 and FD0.

Furthermore, because the source clocks RCLK and FCLK include the first internal clock RCLK and the second internal clock FCLK, and the delayed source clocks DRCLK and DFCLK include the first delayed internal clock DRCLK and the second delayed internal clock DFCLK, the driving signal generation unit 320 selects one of the first internal clock RCLK and the first delayed internal clock DRCLK based on the logic levels of the first driving signal PU<0> and the second driving signal PD<0> before a generation time point of the first edge of the first internal clock RCLK, and then determines the logic levels of the first driving signal PU<0> and the second driving signal PD<0> after a generation time point of the first edge of the selected clock based on the input data RD0 and FD0. Furthermore, the driving signal generation unit 320 selects one of the second internal clock FCLK and the second delayed internal clock DFCLK based on the logic levels of the first driving signal PU<0> and the second driving signal PD<0> before a generation time point of the first edge of the second internal clock FCLK, and then determines the logic levels of the first driving signal PU<0> and the second driving signal PD<0> after a generation time point of the first edge of the selected clock according to the input data RD0 and FD0.

In detail, among the elements of the driving signal generation unit 320, the first driving signal output section 322 is configured to decide the logic level of the first driving signal PU<0> in response to the input data RD0 and FD0. At this time, when the first driving signal PU<0> has a first logic level before the generation time points of the first edges of the source clocks RCLK and FCLK, the first driving signal output section 322 determines transition of the first logic level to a second logic level after the generation time points of the first edges of the source clocks RCLK and FCLK based on the input data RD0 and FD0. Furthermore, when the first driving signal PU<0> has the second logic level before the generation time points of the first edges of the source clocks RCLK and FCLK, the first driving signal output section 322 determines transition of the second logic level to the first logic level after the generation time points of the first edges of the delayed source clocks DRCLK and DFCLK based on the input data RD0 and FD0. When the first driving signal PU<0> has the first logic level before the generation time points of the second edges of the source clocks RCLK and FCLK, the first driving signal output section 322 determines transition of the first logic level to the second logic level after the generation time points of the second edges of the source clocks RCLK and FCLK based on the input data RD0 and FD0. Furthermore, when the first driving signal PU<O> has the second logic level before the generation time points of the second edges of the source clocks RCLK and FCLK, the first driving signal output section 322 determines transition of the second logic level to the first logic level after the generation time points of the second edges of the delayed source clocks DRCLK and DFCLK based on the input data RD0 and FD0.

That is, when the first driving signal PU<0> has the second logic level before the generation time points of the first edges of the source clocks RCLK and FCLK, the first driving signal output section 322 determines logic level transition at a time point delayed by a given time as compared with the case in which the first driving signal PU<0> has the first logic level.

Among the elements of the first driving signal output section 322, the first logic detection part 3222 is configured to generate a first logic detection signal RLUD, which is activated when the first driving signal PU<0> has the first logic level before the generation time points of the first or second edge of the source clocks RCLK and FCLK and is deactivated when the first driving signal PU<0> has the second logic level before the generation time points of the first or second edge of the source clocks RCLK and FCLK.

Among the elements of the first driving signal output section 322, the first clock selection output part 3224 is configured to receive the source clocks RCLK and FCLK and the delayed source clocks DRCLK and DFCLK, to output the source clocks RCLK and FCLK when the first logic detection signal RLUD is activated, and to output the delayed source clocks DRCLK and DFCLK when the first logic detection signal RLUD is deactivated.

Furthermore, based on the fact that the source clocks RCLK and FCLK include the first internal clock RCLK and the second internal clock FCLK, and the delayed source clocks DRCLK and DFCLK include the first delayed internal clock DRCLK and the second delayed internal clock DFCLK, the first clock selection output part 3224 includes a clock selection multiplexer RMUX1 and a clock selection multiplexer FMUX1, wherein the clock selection multiplexer RMUX1 is configured to receive the first internal clock RCLK and the first delayed internal clock DRCLK, to output the first internal clock RCLK when the first logic detection signal RLUD is activated, and to output the first delayed internal clock DRCLK when the first logic detection signal RLUD is deactivated, and the clock selection multiplexer FMUX1 is configured to receive the second internal clock FCLK and the second delayed internal clock DFCLK, to output the second internal clock FCLK when the first logic detection signal RLUD is activated, and to output the second delayed internal clock DFCLK when the first logic detection signal RLUD is deactivated.

Among the elements of the first driving signal output section 322, the first logic decision part 3226 is configured to decide the logic level of the first driving signal PU<O> after the first edge or the second edge of the clock (RCLK or DRCLK, FCLK or DFCLK), which is output from the first clock selection output part 3224, based on values of the input data RD0 and FD0.

Similarly, among the elements of the driving signal generation unit 320, the second driving signal output section 324 is configured to decide the logic level of the second driving signal PD<0> in response to the input data RD0 and FD0. At this time, when the second driving signal PD<0> has a first logic level before the generation time points of the first edges of the source clocks RCLK and FCLK, the second driving signal output section 324 determines transition of the first logic level to a second logic level after the generation time points of the first edges of the delayed source clocks DRCLK and DFCLK based on the input data RD0 and FD0. Furthermore, when the second driving signal PD<0> has the second logic level before the generation time points of the first edges of the source clocks RCLK and FCLK, the second driving signal output section 324 determines transition of the second logic level to the first logic level after the generation time points of the first edges of the source clocks RCLK and FCLK based on the input data RD0 and FD0. When the second driving signal PD<0> has the first logic level before the generation time points of the second edges of the source clocks RCLK and FCLK, the second driving signal output section 324 determines transition of the first logic level to the second logic level after the generation time points of the second edges of the delayed source clocks DRCLK and DFCLK based on the input data RD0 and FD0. Furthermore, when the second driving signal PD<0> has the second logic level before the generation time points of the second edges of the source clocks RCLK and FCLK, the second driving signal output section 324 determines transition of the second logic level to the first logic level after the generation time points of the first edges of the source clocks RCLK and FCLK based on the input data RD0 and FD0.

That is, when the second driving signal PD<O> has the second logic level before the generation time points of the first edges of the source clocks RCLK and FCLK, the second driving signal output section 324 determines logic level transition at a time point delayed by a given time as compared with the case in which the second driving signal PD<O> has the first logic level.

Among the elements of the second driving signal output section 324, the second logic detection part 3242 is configured to generate a second logic detection signal DLUD which is activated when the second driving signal PD<0> has the first logic level before the generation time points of the first or second edge of the source clocks RCLK and FCLK, and is deactivated when the second driving signal PD<0> has the second logic level before the generation time points of the first or second edge of the source clocks RCLK and FCLK.

Among the elements of the second driving signal output section 324, the second clock selection output part 3244 is configured to receive the source clocks RCLK and FCLK and the delayed source clocks DRCLK and DFCLK, to output the delayed source clocks DRCLK and DFCLK when the second logic detection signal DLUD is activated, and to output the source clocks RCLK and FCLK when the second logic detection signal DLUD is deactivated.

Furthermore, because the source clocks RCLK and FCLK include the first internal clock RCLK and the second internal clock FCLK, and the delayed source clocks DRCLK and DFCLK include the first delayed internal clock DRCLK and the second delayed internal clock DFCLK, the second clock selection output part 3244 includes a clock selection multiplexer RMUX2 and a clock selection multiplexer FMUX2, wherein the clock selection multiplexer RMUX2 is configured to receive the first internal clock RCLK and the first delayed internal clock DRCLK, to output the first delayed internal clock DRCLK when the second logic detection signal DLUD is activated, and to output the first internal clock RCLK when the second logic detection signal DLUD is deactivated, and the clock selection multiplexer FMUX2 is configured to receive the second internal clock FCLK and the second delayed internal clock DFCLK, to output the second delayed internal clock DFCLK when the second logic detection signal DLUD is activated, and to output the second internal clock FCLK when the second logic detection signal DLUD is deactivated.

Among the elements of the second driving signal output section 324, the second logic decision part 3246 is configured to decide the logic level of the second driving signal PD<0> after the first edge or the second edge of the clock (RCLK or DRCLK, FCLK or DFCLK), which is output from the second clock selection output part 3244, based on the values of the input data RD0 and FD0.

As described above, it may be understood that the first driving signal output section 322 and the second driving signal output section 324 perform an opposite operation even when the logic level of the first driving signal PU<0> and the logic level of the second driving signal PD<0> before the generation time points of the first edges of the source clocks RCLK and FCLK are substantially equal to each other.

Accordingly, a transition time point of the first logic level of the first driving signal PU<0> to the second logic level is earlier than a transition time point of the first logic level of the second driving signal PD<0> to the second logic level by a given time. Meanwhile, a transition time point of the second logic level of the second driving signal PD<0> to the first logic level is earlier than a transition time point of the second logic level of the first driving signal PU<0> to the first logic level by a given time. Therefore, it may not be possible that the first logic level period of the first driving signal PU<0> overlaps the second logic level period of the second driving signal PD<0>, and it may not be possible that the second logic level period of the first driving signal PU<0> overlaps the first logic level period of the second driving signal PD<0>.

In the aforementioned description for the driving signal generation unit 320, the logic levels of the first driving signal PU<0> and the second driving signal PD<0> are determined based on the values of the input data RD0 and FD0. This will be described in detail as follow.

The input data RD0 and FD0 include first input data RD0 and second input data FD0.

The first input data RD0 is a value to be used as a reference when the logic levels of the first driving signal PU<0> and the second driving signal PD<0> are determined based on the first edges of the source clocks RCLK and FCLK or the first edges of the delayed source clocks DRCLK and DFCLK.

Similarly, the first input data RD0 is a value to be used as a reference when the logic levels of the first driving signal PU<0> and the second driving signal PD<0> are determined based on the first edge of the first internal clock RCLK or the first edge of the first delayed internal clock DRCLK.

The second input data FD0 is a value to be used as a reference when the logic levels of the first driving signal PU<0> and the second driving signal PD<0> are determined based on the second edges of the source clocks RCLK and FCLK or the second edges of the delayed source clocks DRCLK and DFCLK.

Similarly, the second input data FD0 is a value to be used as a reference when the logic levels of the first driving signal PU<0> and the second driving signal PD<0> are determined based on the first edge of the second internal clock FCLK or the first edge of the second delayed internal clock DFCLK.

In the configuration in which the input data RD0 and FD0 include the first input data RD0 and the second input data FD0 as described above, when the first input data RD0 has a second logic level and the second input data FD0 has a first logic level, the first driving signal output section 322 and the second driving signal output section 324 of the driving signal generation unit 320 operate as follows.

The first driving signal output section 322 determines the logic level of the first driving signal PU<0> in response to the first input data RD0 and the second input data FD0. At this time, when the first driving signal PU<0> has the first logic level, the first driving signal output section 322 may determine transition of the first logic level of the first driving signal PU<0> to the second logic level based on the first edges of the source clocks RCLK and FCLK or the first edge of the first internal clock RCLK. When the first driving signal PU<0> has the second logic level, the first driving signal output section 322 may determine transition of the second logic level of the first driving signal PU<0> to the first logic level based on the second edges of the delayed source clocks DRCLK and DFCLK or the first edge of the second delayed internal clock DFCLK.

The second driving signal output section 324 determines the logic level of the second driving signal PD<0> in response to the first input data RD0 and the second input data FD0. At this time, when the second driving signal PD<0> has the first logic level, the first driving signal output section 322 may determine transition of the first logic level of the second driving signal PD<0> to the second logic level based on the first edges of the delayed source clocks DRCLK and DFCLK or the first edge of the first delayed internal clock DRCLK. When the second driving signal PD<0> has the second logic level, the first driving signal output section 322 may determine transition of the second logic level of the second driving signal PD<0> to the first logic level based on the second edges of the source clocks RCLK and FCLK or the first edge of the second internal clock FCLK.

Furthermore, in the configuration in which the input data RD0 and FD0 include the first input data RD0 and the second input data FD0, when the first input data RD0 has the first logic level and the second input data FD0 has the second logic level, the first driving signal output section 322 and the second driving signal output section 324 of the driving signal generation unit 320 operate as follows.

The first driving signal output section 322 determines the logic level of the first driving signal PU<0> in response to the first input data RD0 and the second input data FD0. At this time, when the first driving signal PU<0> has the first logic level, the first driving signal output section 322 may determine transition of the first logic level of the first driving signal PU<0> to the second logic level based on the second edges of the source clocks RCLK and FCLK or the first edge of the second internal clock FCLK. When the first driving signal PU<0> has the second logic level, the first driving signal output section 322 may determine transition of the second logic level of the first driving signal PU<0> to the first logic level based on the first edges of the delayed source clocks DRCLK and DFCLK or the first edge of the first delayed internal clock DRCLK.

The second driving signal output section 324 determines the logic level of the second driving signal PD<0> in response to the first input data RD0 and the second input data FD0. At this time, when the second driving signal PD<0> has the first logic level, the first driving signal output section 322 may determine transition of the first logic level of the second driving signal PD<0> to the second logic level based on the second edges of the delayed source clocks DRCLK and DFCLK or the first edge of the second delayed internal clock DFCLK. When the second driving signal PD<0> has the second logic level, the first driving signal output section 322 may determine transition of the second logic level of the second driving signal PD<0> to the first logic level based on the first edges of the source clocks RCLK and FCLK or the first edge of the first internal clock RCLK.

The output pad driving unit 340 is configured to drive the data output pad DQ with a first voltage in response to the first driving signal PU<0>, and to drive the data output pad DQ with a second voltage in response to the second driving signal PD<0>.

Between the elements of the output pad driving unit 340, the first output pad driving section 342 is configured to be enabled in the first logic level period of the first driving signal PU<0> to drive the data output pad DQ with the first voltage, and to be disabled in the second logic level period of the first driving signal PU<0> to perform no operation.

Between the elements of the output pad driving unit 340, the second output pad driving section 344 is configured to be enabled in the second logic level period of the second driving signal PD<0> to drive the data output pad DQ with the second voltage, and to be disabled in the first logic level period of the second driving signal PD<0> to perform no operation.

The first output pad driving section 342 illustrated in FIG. 3 may be an element obtained by combining the first to fourth pull-up delay elements 1024 to 1027 with the first to fourth pull-up driving sections 104 to 107, which are illustrated in FIG. 1. That is, the first output pad driving section 342 is configured to perform operations for delaying the first logic level period of the first driving signal PU<0> in several steps, and driving the data output pad DQ with the first voltage.

Similarly, the second output pad driving section 344 illustrated in FIG. 3 may be an element obtained by combining the first to fourth pull-down delay elements 1224 to 1227 with the first to fourth pull-down driving sections 124 to 127, which are illustrated in FIG. 1. That is, the second output pad driving section 344 is configured to perform operations for delaying the second logic level period of the second driving signal PD<0> in several steps, and driving the data output pad DQ with the second voltage.

In the description for the data output circuit in accordance with the embodiment of the present invention, the first logic level indicates logic 'low' and the second logic level indicates logic 'high'. Accordingly, the first edge indicates a rising edge and the second edge indicates a falling edge. Accordingly, the first voltage indicates the power supply voltage VDD and the second voltage indicates the ground voltage VSS. Accordingly, the first output pad driving section 342 is an element that pull-up drives the data output pad DQ with the power supply voltage VDD as illustrated in FIG. 3. Furthermore, the second output pad driving section 344 is an element that pull-down drives the data output pad DQ with the ground voltage VSS as illustrated in FIG. 3.

Meanwhile, in the description for the data output circuit in accordance with the embodiment of the present invention, the first logic level may indicate logic 'high' and the second logic level may indicate logic 'low'. Accordingly, the first edge indicates a falling edge and the second edge indicates a rising edge. Accordingly, the first voltage indicates the ground voltage VSS and the second voltage indicates the power supply voltage VDD. Accordingly, the first output pad driving section 342 is an element that pull-down drives the data output pad DQ with the ground voltage VSS as illustrated in FIG. 3. Furthermore, the second output pad driving section 344 is an element that pull-up drives the data output pad DQ with the power supply voltage VDD as illustrated in FIG. 3.

Figure 4:
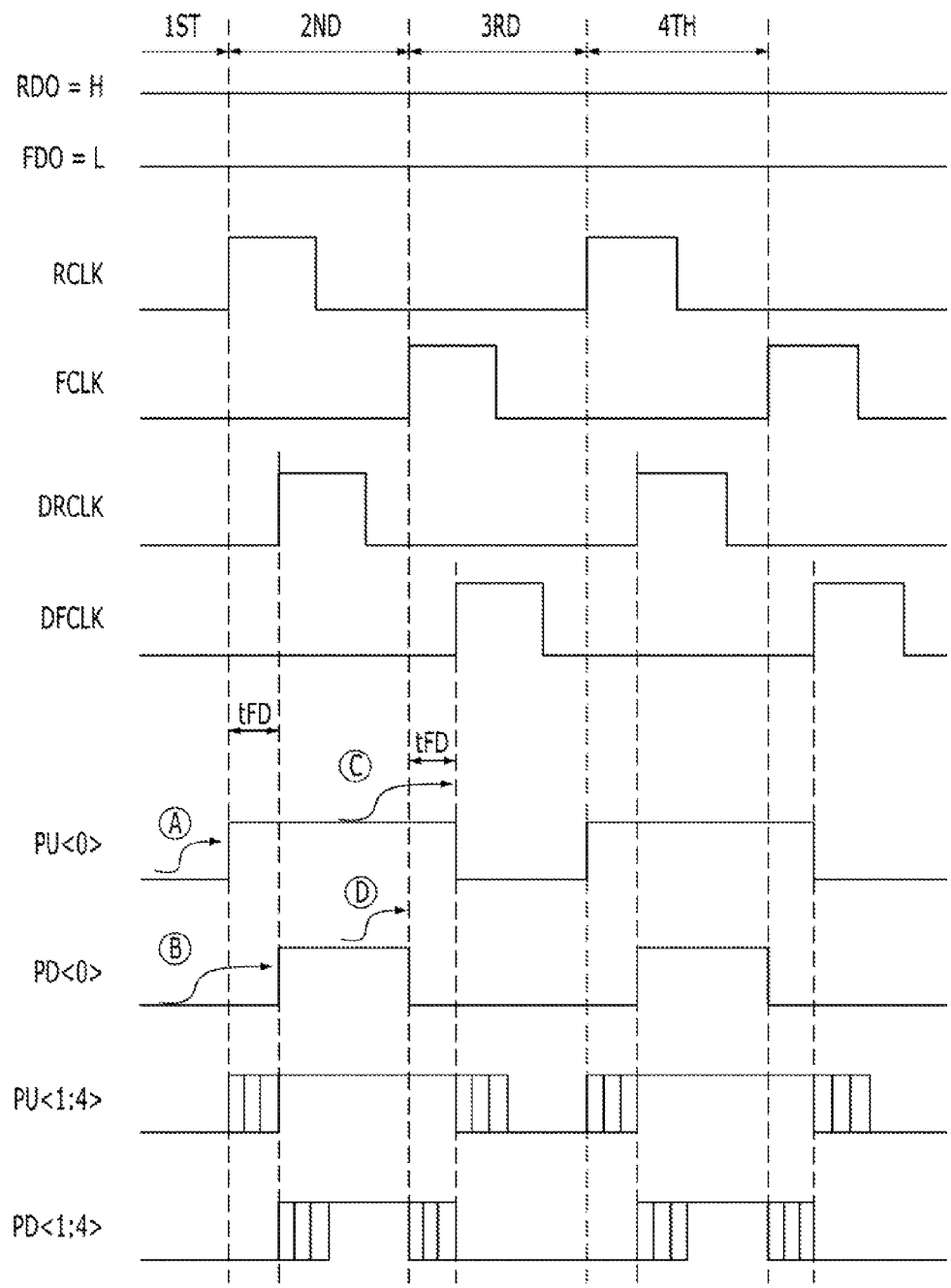
FIG. 4 is a timing diagram illustrating the operation of the data output circuit shown in FIG. 3.
Figure 5:
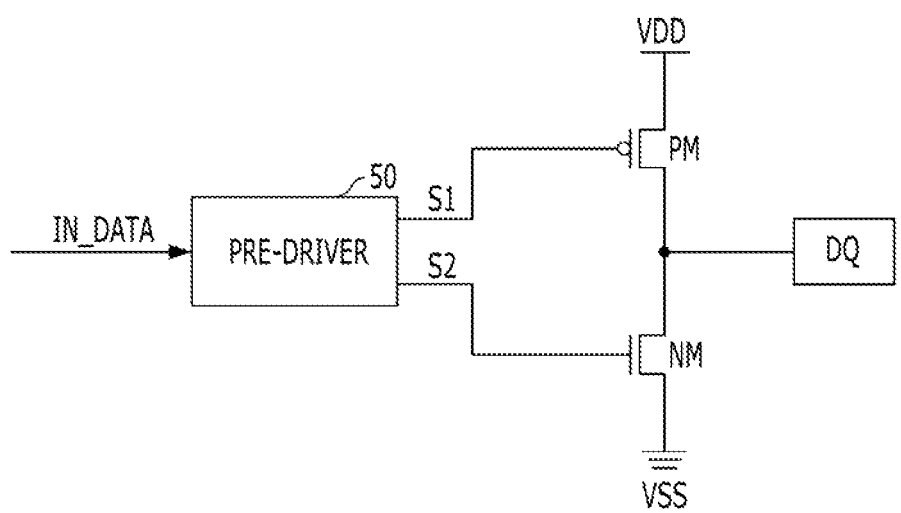
FIG. 5 is a block diagram illustrating a data output circuit of a conventional semiconductor device.

FIG. 4 is a timing diagram illustrating the operation of the data output circuit shown in FIG. 3.

Referring to FIG. 4, it may be understood that the first input data RD0 is at a logic 'high' level, the second input data FD0 is at a logic 'low' level, and the first internal clock RCLK and the second internal clock FCLK are alternately toggled while substantially maintaining a given phase difference. Furthermore, it may be understood that the first delayed internal clock DRCLK is delayed from the first internal clock RCLK by a given delay amount tFD, and the second delayed internal clock DFCLK is delayed from the second internal clock FCLK by the given delay amount tFD.

In detail, the first driving signal PU<O> and the second driving signal PD<O> are at a logic 'low' level in a first period 1ST before the generation time point of the rising edge of the first internal clock RCLK.

Accordingly, it may be understood that a transition operation of the logic 'low' level of the first driving signal PU<0> to the logic 'high' level is performed based on the rising edge of the first internal clock RCLK (A).

Similarly, it may be understood that a transition operation of the logic 'low' level of the second driving signal PD<0> to the logic 'high' level is performed based on the rising edge of the first delayed internal clock DRCLK (B).

At this time, since the second internal clock FCLK is toggled with a phase difference larger than a time corresponding to the given delay amount tFD as compared with the first internal clock RCLK, it may be understood that a time point after the first driving signal PU<0> and the second driving signal PD<0> are transitioned to the logic 'high' level is a second period 2ND before the generation time point of the rising edge of the second internal clock FCLK.

Accordingly, in the period 2ND before the generation time point of the rising edge of the second internal clock FCLK, the first driving signal PU<0> and the second driving signal PD<0> are at the logic 'high' level.

Accordingly, it may be understood that a transition operation of the logic 'high' level of the first driving signal PU<0> to the logic 'low' level is performed based on the rising edge of the second delayed internal clock DFCLK (C).

Similarly, it may be understood that a transition operation of the logic 'high' level of the second driving signal PD<0> to the logic 'low' level is performed based on the rising edge of the second internal clock FCLK (D).

At this time, since the first internal clock RCLK and the second internal clock FCLK are toggled with a phase difference larger than a time corresponding to the preset delay amount tFD, it may be understood that a time point after the first driving signal PU<0> and the second driving signal PD<0> are transitioned to the logic 'low' level is a third period 3RD before the generation time point of the rising edge of the first internal clock RCLK.

Accordingly, it may be understood that in the third period 3RD before the generation time point of the rising edge of the first internal clock RCLK, since the first driving signal PU<0> and the second driving signal PD<0> are at the logic 'low' level and this state is substantially equal to the logic level states of the first driving signal PU<0> and the second driving signal PD<0> in the first period before the generation time point of the rising edge of the first internal clock RCLK, the operation may be continuously repeated as long as the logic level values of the input data RD0 and FD0 are not changed.

In brief, the logic 'high' period of the first driving signal PU<0> is defined between the rising edge of the first internal clock RCLK and the rising edge of the second delayed internal clock DFCLK, and the logic 'low' period of the first driving signal PU<0> is defined between the rising edge of the second delayed internal clock DFCLK and the rising edge of the first internal clock RCLK.

Furthermore, the logic 'high' period of the second driving signal PD<0> is defined between the rising edge of the first delayed internal clock DRCLK and the rising edge of the second internal clock FCLK, and the logic 'low' period of the second driving signal PD<0> is defined between the rising edge of the second internal clock FCLK and the rising edge of the first delayed internal clock DRCLK.

Accordingly, the logic 'low' period of the first driving signal PU<0> and the logic 'high' period of the second driving signal PD<0> are separated from each other by a time corresponding to the given delay amount tFD at any case.

This is because the data output pad DQ is pull-up driven with the power supply voltage VDD in the logic 'low' period of the first driving signal PU<0> and the data output pad DQ is pull-down driven with the ground voltage VSS in the logic 'high' period of the second driving signal PD<0>, the period, in which the data output pad DQ is pull-up driven with the power supply voltage VDD, is separated from the period, in which the data output pad DQ is pull-down driven with the ground voltage VSS, by the time corresponding to the given delay amount tFD.

That is, this satisfies the condition for substantially preventing a through current from being generated when the data output pad DQ is pull-up driven with the power supply voltage VDD and when the data output pad DQ is pull-down driven with the ground voltage VSS, so that it is possible for the data output circuit to substantially prevent the occurrence of overlapping.

In this way, the logic 'low' period of the first driving signal PU<0> and the logic 'high' period of the second driving signal PD<0> are separated from each other by the time corresponding to the given delay amount tFD at any cases, and thus, it may be possible to stabilize a skew of the period, in which the data output pad DQ is pull-up driven with the power supply voltage VDD, by delaying the first driving signal PU<0> and the second driving signal PD<0> step by step while substantially maintaining a time difference as illustrated in FIG. 4 (PU<0:4> and PD<0:4>) even when there is a PVT variation such as a variation in the level of the power supply voltage VDD.

Furthermore, the transition time points of the logic levels of the first driving signal PU<0> and the second driving signal PD<0> are determined based on the first internal clock RCLK, the second internal clock FCLK, the first delayed internal clock DRCLK, and the second delayed internal clock DFCLK, and thus, it may be possible to substantially prevent an arbitrary delay amount async delay from being added when the logic levels of the first driving signal PU<0> and the second driving signal PD<0> are determined.

That is, the transition operation of the logic levels of the first driving signal PU<0> and the second driving signal PD<0> is a synchronized operation which is performed based on toggling of a clock.

Accordingly, even when the level of the power supply voltage VDD in an actual operation is further higher or lower than the estimated level of the power supply voltage VDD in a design, it may be possible to substantially prevent the transition time points of the logic levels of the first driving signal PU<0> and the second driving signal PD<0> from being arbitrarily changed. That is, it may be possible to substantially prevent tAA loss from occurring in data output from the data output pad DQ.

As described above, when applying the embodiment of the present invention, the operation for pull-up driving the data output pad DQ with the power supply voltage VDD and the operation for pull-down driving the data output pad DQ with the ground voltage VSS are performed while substantially maintaining a time difference corresponding the given delay amount tFD, thereby substantially preventing overlapping from occurring in the data output circuit.

Furthermore, the operation for determining the logic level of the first driving signal PU<0> for defining the operation for pull-up driving the data output pad DQ with the power supply voltage VDD and the operation for determining the logic level of the second driving signal PD<0> for defining the operation for pull-down driving the data output pad DQ with the ground voltage VSS are performed in synchronization with a clock, thereby substantially preventing tAA loss from occurring in data output from the data output pad DQ due to a PVT (Process, Voltage, and Temperature) variation.

While the present invention has been described with respect to the specific embodiments, it will be apparent to those skilled in the art that various changes and modifications may be made without departing from the spirit and scope of the invention as defined in the following claims.

For example, it is noted that the positions and types of the logic gate and the transistor described in the aforementioned embodiment may be different from each other based on the polarity of an input signal.

What is claimed is:

1. A semiconductor device comprising:
   a clock delay unit configured to delay a source clock by a given delay amount and generate a delayed source clock;
   a driving signal generation unit configured to decide logic levels of a first driving signal and a second driving signal based on a value of input data, to select one of the source clock and the delayed source clock based on current logic levels of the first driving signal and the second driving signal, which are detected based on the source clock, and to use a selected clock as a reference of an operation for determining next logic levels of the first driving signal and the second driving signal; and
   an output pad driving unit configured to drive a data output pad with a first voltage in response to the first driving signal, and to drive the data output pad with a second voltage in response to the second driving signal.

2. The semiconductor device of claim 1, wherein the driving signal generation unit comprises:
   a first driving signal output section configured to decide the logic level of the first driving signal in response to the input data, to determine transition to a second logic level based on the source clock when the first driving signal is at a first logic level, and to determine transition to the first logic level based on the delayed source clock when the first driving signal is at the second logic level; and
   a second driving signal output section configured to decide the logic level of the second driving signal in response to the input data, to determine transition to the second logic level based on the delayed source clock when the second driving signal is at the first logic level, and to determine transition to the first logic level based on the source clock when the second driving signal is at the second logic level.

3. The semiconductor device of claim 2, wherein the first driving signal output section comprises:
   a first logic detection part configured to generate a first logic detection signal which is activated when the first driving signal is at the first logic level, and is deactivated when the first driving signal is at the second logic level;
   a first clock selection output part configured to output the source clock when the first logic detection signal is activated, and to output the delayed source clock when the first logic detection signal is deactivated; and
   a first logic decision part configured to decide the logic level of the first driving signal in response to the input data, and to change the logic level of the first driving signal based on an output clock of the first clock selection output part.

4. The semiconductor device of claim 3, wherein the second driving signal output section comprises:
   a second logic detection part configured to generate a second logic detection signal, which is activated when the second driving signal is at the first logic level, and is deactivated when the second driving signal is at the second logic level;
   a second clock selection output part configured to output the source clock when the second logic detection signal is deactivated, and to output the delayed source clock when the second logic detection signal is activated; and
   a second logic decision part configured to decide the logic level of the second driving signal in response to the input data, and to change the logic level of the second driving signal based on an output clock of the second clock selection output part.

5. The semiconductor device of claim 4, wherein the output pad driving unit comprises:
   a first output pad driving section configured to be enabled in a first logic level period of the first driving signal to drive the data output pad with the first voltage, and to be disabled in a second logic level period of the first driving signal; and
   a second output pad driving section configured to be enabled in a second logic level period of the second driving signal to drive the data output pad with the second voltage, and to be disabled in a first logic level period of the second driving signal.

6. The semiconductor device of claim 1, wherein the source clock includes a first internal clock having a first edge defined in correspondence with a first edge of the source clock, and a second internal clock having a first edge defined in correspondence with a second edge of the source clock.

7. The semiconductor device of claim 6, wherein the clock delay unit comprises:
   a first internal clock delay section configured to delay the first internal clock by the given delay amount and output a first delayed internal clock; and a second internal clock delay section configured to delay the second internal clock by the given delay amount and output a second delayed internal clock.

8. The semiconductor device of claim 7, wherein the input data includes first input data for determining the logic levels of the first driving signal and the second driving signal based on the first internal clock and the first delayed internal clock, and second input data for determining the logic levels of the first driving signal and the second driving signal based on the second internal clock and the second delayed internal clock.

9. The semiconductor device of claim 8, wherein the driving signal generation unit comprises:
a first driving signal output section configured to decide the logic level of the first driving signal in response to the first input data and the second input data, to determine transition to a second logic level based on the first internal clock when the first driving signal is at a first logic level, and to determine transition to the first logic level based on the second delayed internal clock when the first driving signal is at the second logic level in a case in which the first input data is at the second logic level, and the second input data is at the first logic level; and
a second driving signal output section configured to decide the logic level of the second driving signal in response to the first input data and the second input data, to determine transition to the second logic level based on the first internal clock when the second driving signal is at the first logic level, and to determine transition to the first logic level based on the second internal clock when the second driving signal is at the second logic level in a case in which the first input data is at the second logic level, and the second input data is at the first logic level.

10. The semiconductor device of claim 8, wherein the driving signal generation unit comprises:
a first driving signal output section configured to decide the logic level of the first driving signal in response to the first input data and the second input data, to determine transition to the first logic level based on the first delayed internal clock when the first driving signal is at the second logic level, and to determine transition to the second logic level based on the second internal clock when the first driving signal is at the first logic level in a case in which the first input data is at the first logic level, and the second input data is at the second logic level; and
a second driving signal output section configured to decide the logic level of the second driving signal in response to the first input data and the second input data, to determine transition to the second logic level based on the first internal clock when the second driving signal is at the second logic level, and to determine transition to the first logic level based on the second internal clock when the second driving signal is at the first logic level in a case in which the first input data is at the first logic level, and the second input data is at the second logic level.

11. The semiconductor device of claim 10, wherein the output pad driving unit comprises:
a first output pad driving section configured to be enabled in a first logic level period of the first driving signal to drive the data output pad with the first voltage, and to be disabled in a second logic level period of the first driving signal; and
a second output pad driving section configured to be enabled in a second logic level period of the second driving signal to drive the data output pad with the second voltage, and to be disabled in a first logic level period of the second driving signal.

12. An operation method of a semiconductor device, comprising:
delaying a source clock by a given delay amount and generating a delayed source clock;
determining logic levels of a first driving signal and a second driving signal based on a value of input data;
selecting one of the source clock and the delayed source clock based on the current logic levels of the first driving signal and the second driving signal, which are detected based on the source clock, and using a selected clock as a reference of an operation for determining next logic levels of the first driving signal and the second driving signal; and
driving a data output pad with a first voltage in a first logic level period of the first driving signal, and driving the data output pad with a second voltage in a second logic level period of the second driving signal.

13. The operation method of claim 12, wherein the using of the selected clock comprises:
allowing a transition time point to a second logic level based on the input data to correspond to the source clock when the first driving signal is detected at a first logic level;
allowing a transition time point to the first logic level based on the input data to correspond to the delayed source clock when the first driving signal is detected at the second logic level;
allowing a transition time point to the second logic level based on the input data to correspond to the delayed source clock when the second driving signal is detected at the first logic level; and
allowing a transition time point to the first logic level based on the input data to correspond to the source clock when the second driving signal is detected at the second logic level.

14. The operation method of claim 13, wherein the driving of the data output pad comprises:
driving the data output pad with the first voltage in the first logic level period of the first driving signal, and performing no operation in the second logic level period; and
driving the data output pad with the second voltage in the second logic level period of the second driving signal, and performing no operation in the first logic level period.

15. The operation method of claim 12, wherein the source clock includes a first internal clock having a first edge defined in correspondence with a first edge of the source clock, and a second internal clock having a first edge defined in correspondence with a second edge of the source clock.

16. The operation method of claim 15, wherein the generating of the delayed source clock comprises:
delaying the first internal clock by the given delay amount and outputting a first delayed internal clock; and
delaying the second internal clock by the given delay amount and outputting a second delayed internal clock.

17. The operation method of claim 16, wherein the input data includes first input data for determining the logic levels of the first driving signal and the second driving signal based on the first internal clock and the first delayed internal clock, and second input data for determining the logic levels of the first driving signal and the second driving signal based on the second internal clock and the second delayed internal clock.

18. The operation method of claim 17, wherein the using of the selected clock when the first input data is at a second logic level and the second input data is at a first logic level comprises:
- allowing a transition time point to a second logic level based on the input data to correspond to the first internal clock when the first driving signal is detected at a first logic level;
- allowing a transition time point to the first logic level based on the input data to correspond to the second delayed internal clock when the first driving signal is detected at the second logic level;
- allowing a transition time point to the second logic level based on the input data to correspond to the first delayed internal clock when the second driving signal is detected at the first logic level; and
- allowing a transition time point to the first logic level based on the input data to correspond to the second internal clock when the second driving signal is detected at the second logic level.

19. The operation method of claim 18, wherein the using of the selected clock when the first input data is at the first logic level and the second input data is at the second logic level comprises:
- allowing a transition time point to the second logic level based on the input data to correspond to the second internal clock when the first driving signal is detected at the first logic level;
- allowing a transition time point to the first logic level based on the input data to correspond to the first delayed internal clock when the first driving signal is detected at the second logic level;
- allowing a transition time point to the second logic level based on the input data to correspond to the second delayed internal clock when the second driving signal is detected at the first logic level; and
- allowing a transition time point to the first logic level based on the input data to correspond to the first internal clock when the second driving signal is detected at the second logic level.

20. The operation method of claim 19, wherein the driving of the data output pad comprises:
- driving the data output pad with the first voltage in the first logic level period of the first driving signal, and performing no operation in the second logic level period; and
- driving the data output pad with the second voltage in the second logic level period of the second driving signal, and performing no operation in the first logic level period.

* * * * *